(12) United States Patent
Jin et al.

(10) Patent No.: US 6,960,785 B2
(45) Date of Patent: Nov. 1, 2005

(54) MOSFET AND METHOD OF FABRICATING THE SAME

(75) Inventors: You-seung Jin, Seoul (KR); Jong-hyon Ahn, Kyungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/676,304

(22) Filed: Sep. 30, 2003

(65) Prior Publication Data

US 2004/0132258 A1 Jul. 8, 2004

(30) Foreign Application Priority Data

Jan. 7, 2003 (KR) .............................. 10-2003-0000838

(51) Int. Cl.[7] .............................................. H01L 29/04
(52) U.S. Cl. ........................... 257/57; 257/69; 257/213
(58) Field of Search .................................. 257/336, 408

(56) References Cited

U.S. PATENT DOCUMENTS 5,648,287 A * 7/1997 Tsai et al. .................. 438/305
2002/0195660 A1 12/2002 Lee

FOREIGN PATENT DOCUMENTS

KR  1998-040751   8/1998
KR  2002-0091886  12/2002

OTHER PUBLICATIONS

English language abstract of Korean Publication No. 1998–040751.
English language abstract of Korean Publication No. 2002–0091886.

* cited by examiner

*Primary Examiner*—Fetsum Abraham
(74) *Attorney, Agent, or Firm*—Marger Johnson & McCollom, P.C.

(57) ABSTRACT

A MOSFET includes a semiconductor substrate with a first region having a relatively thick first thickness and a second region having a relatively thin second thickness; a gate insulating layer pattern formed on the first region of the semiconductor substrate; a gate conductive layer pattern formed on the gate insulating layer pattern; an epitaxial layer formed on the second region of the semiconductor substrate so as to have a predetermined thickness; spacers formed on sidewalls of the gate conductive layer pattern and part of the surface of the epitaxial layer; a lightly-doped first impurity region formed in the semiconductor substrate disposed below the spacers and in the epitaxial layer; and a heavily-doped second impurity region formed in a portion of the semiconductor substrate, exposed by the spacers.

11 Claims, 7 Drawing Sheets

MOSFET AND METHOD OF FABRICATING THE SAME

This application claims the priority to Korean Patent Application No. 2003-00838, filed on Jan. 7, 2003, in the Korean Intellectual Property Office, the contents of which are incorporated herein by reference in its entirety.

BACKGROUND OF THE INVENTION

1. Field of the Invention

The present invention relates to a semiconductor device and a method of fabricating the same, and more particularly, to a MOSFET and a method of fabricating the same.

2. Description of the Related Art

Figure 1:
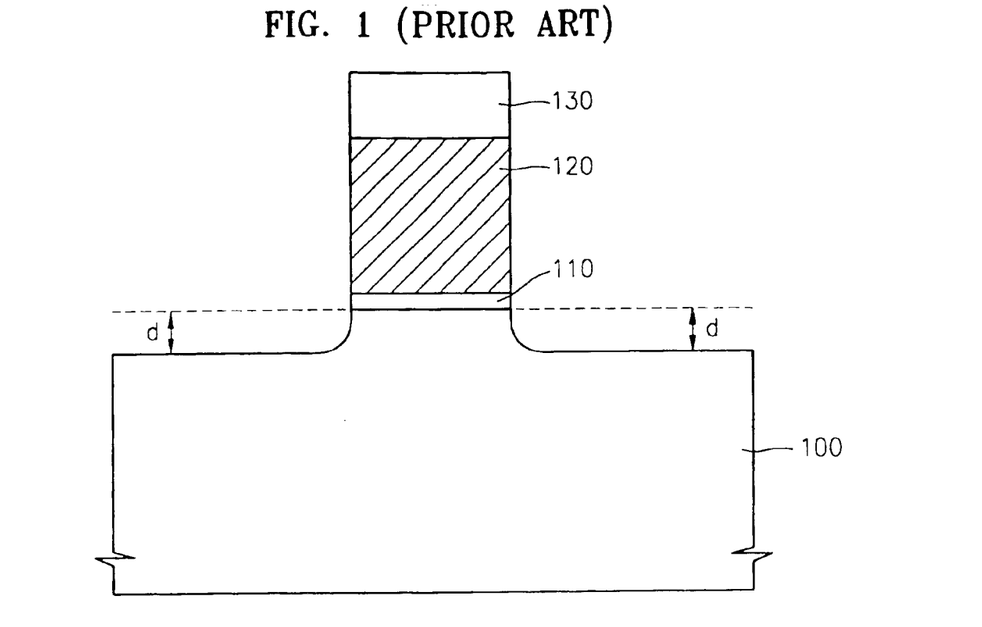
FIGS. 1 and 2 are cross-sectional views illustrating a method of fabricating a conventional MOSFET.
Figure 2:
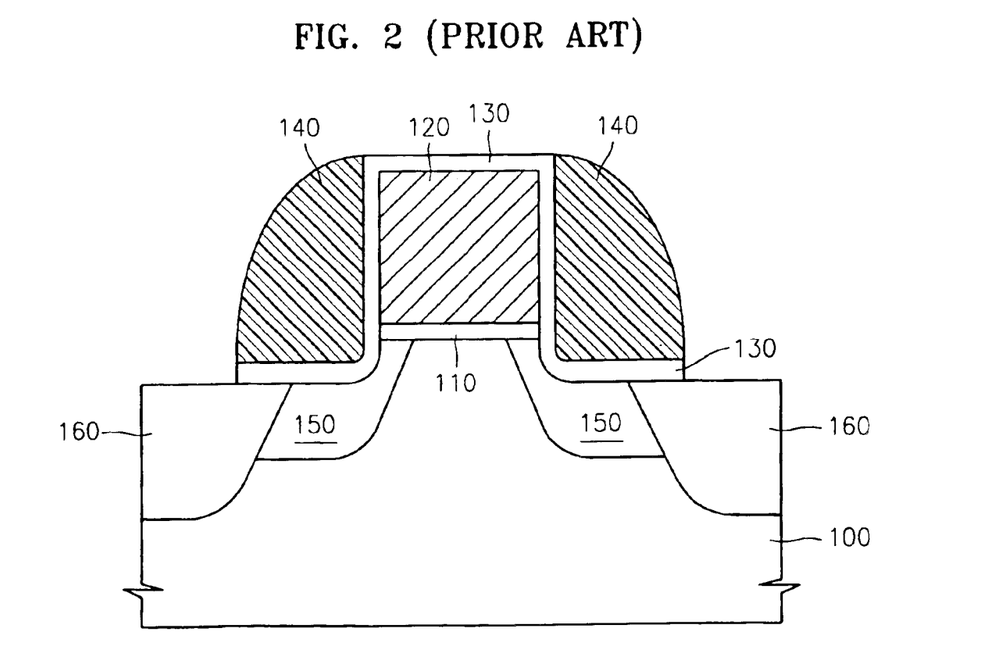

FIGS. 1 and 2 are cross-sectional views illustrating a method of fabricating a conventional MOSFET.

Referring to FIG. 1, an insulating layer and a gate conductive layer are sequentially formed on a semiconductor substrate 100. A mask pattern 130 is formed on the gate conductive layer to expose part of the surface of the gate conductive layer. An etch process is performed by using the mask pattern 130 as an etch mask to remove the exposed part of the gate conductive layer and insulating layer. As a result, a gate insulating layer pattern 110 and a gate conductive layer pattern 120 are formed. Also, part of the surface of the semiconductor substrate 100 is recessed by a predetermined thickness d and exposed. After the etch process is carried out, the mask pattern 130 is removed.

Figure 3:
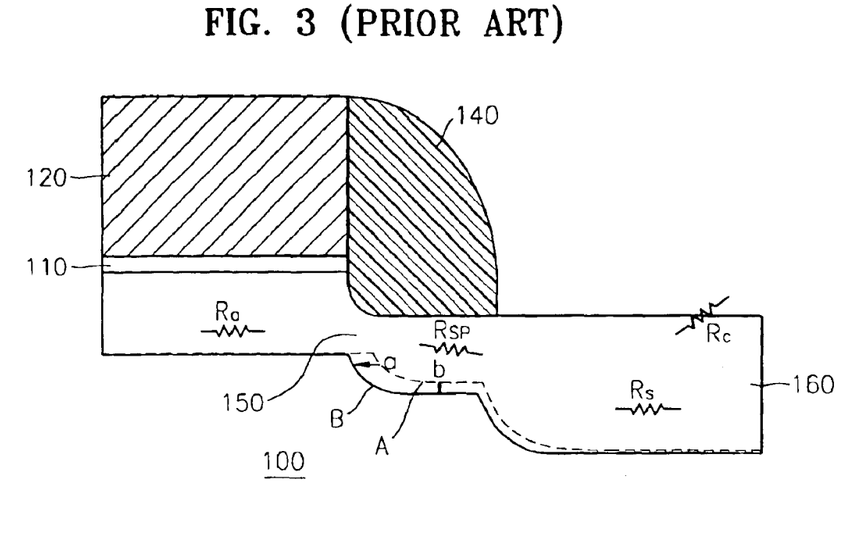
FIG. 3 is a diagram illustrating problems of the conventional MOSFET.

Referring to FIG. 2, an ion implantation buffer layer 130 is formed on the exposed surface of the semiconductor substrate 100 and the exposed surface of the gate conductive layer pattern 120. Next, an ion implantation process is implemented to form a lightly-doped drain (LDD) region 150 in a predetermined upper region of the semiconductor substrate 100. Then, gate spacers 140 are formed on sidewalls of the gate conductive layer pattern 120. Afterwards, another ion implantation process is implemented to form a heavily-doped region, i.e., a source/drain region 160. FIG. 3 is a diagram illustrating problems of the conventional MOSFET. In FIGS. 2 and 3, the same reference numerals represent the same elements.

As described above, the exposed surface of the semiconductor substrate 100 is recessed during the etch process for forming the gate conductive layer pattern 120. In addition, the exposed surface of the semiconductor substrate 100 may be recessed due to the etch process for removing the mask pattern (130 of FIG. 1) or a cleaning process to be performed after the ion implantation process. Because the exposed surface of the semiconductor substrate 100 is recessed, the LDD region 150, which is formed by the subsequent ion implantation process, cannot have a desired profile. That is, referring to FIG. 3, in a case where the exposed surface of the semiconductor substrate 100 is recessed, the LDD region (B) 150 moves to the left as indicated by the bigger arrow as compared with the LDD region (A) 150, which is formed in a case where the exposed surface of the semiconductor substrate 100 is not recessed. Also, the LDD region (B) 150 moves downward by a smaller length than the recessed thickness, as indicated by the smaller arrow. Although not shown in the drawing, it can be easily inferred that a similar phenomenon occurs also on the left side of the gate conductive layer pattern 120.

Accordingly, as the LDD region 150 is further extended toward the semiconductor substrate 100, properties of the MOSFET may be degraded. For example, the effective channel length may be shortened. As the effective channel length is reduced, a known short channel effect (SCE) is highly likely to occur. For another example, the resistance of the source/drain region may increase. While carriers come from the source region and pass through the channel region, the LDD region 150, and the drain region 160, resistances exist along the movement paths of the carriers and include the cumulative resistance Ra of the channel region, the spread resistance Rsp of the LDD region 150, the shunt resistance Rs of the drain region 160, and the contact resistance Rc of a contact region of the drain region 160. Among the resistances, the spread resistance Rsp of the LDD region 150 is affected by the profile of the LDD region 150. That is, because the LDD region 150 moves downward by the smaller length than the recessed thickness, the vertical sectional area of the LDD region 150 is reduced. Thus, the spread resistance Rsp of the LDD region 150 increases more. When the spread resistance Rsp of the LDD region 150 increases, electrical properties of the MOSFET are degraded.

SUMMARY OF THE INVENTION

The present invention provides a MOSFET which can prevent a change in the profile of an impurity region due to a recessed portion of a semiconductor substrate, thus improving electrical properties and operating properties.

The present invention also provides a method of fabricating the foregoing MOSFET.

In accordance with an aspect of the present invention, there is provided a MOSFET, which comprises a semiconductor substrate with a relatively thick first region (the thickness of the first region hereinafter referred to as a first thickness) and a relatively thin second region (the thickness of the second region hereinafter referred to as a second thickness); a gate insulating layer pattern formed on the first region of the semiconductor substrate; a gate conductive layer pattern formed on the gate insulating layer pattern; an epitaxial layer formed on the second region of the semiconductor substrate so as to have a predetermined thickness; spacers formed on sidewalls of the gate conductive layer pattern and part of the surface of the epitaxial layer; a lightly-doped first impurity region formed in the semiconductor substrate disposed below the spacers and in the epitaxial layer; and a heavily-doped second impurity region formed in a portion of the semiconductor substrate, exposed by the spacers.

The semiconductor substrate is a silicon substrate, and the epitaxial layer is a silicon epitaxial layer.

Preferably, the sum of the thickness of the epitaxial layer and the second thickness is greater than the first thickness. In this case, the thickness of the epitaxial layer preferably ranges from approximately 20 to approximately 500 Å.

Preferably, the gate insulating layer pattern and the insulating layer are silicon oxide layers, while the gate conductive layer pattern is a polysilicon pattern. The spacers preferably include double insulating layers.

In accordance with another aspect of the present invention, there is provided a method of fabricating a MOSFET, in which a gate insulating layer pattern, a gate conductive layer pattern, and a mask pattern are sequentially stacked on a first region of a semiconductor substrate, and a second region of the semiconductor substrate is recessed by a predetermined thickness during an etch process using the mask pattern for forming the gate insulating layer pattern and the gate conductive layer pattern. The method of fabricating a MOSFET comprises forming a first insulating layer on the second region of the semiconductor substrate, the exposed sidewalls of the gate conductive layer pattern, and the exposed surface of the mask pattern; forming a second insulating layer on the first insulating layer; forming a first insulating pattern and a second insulating pattern by etching the first insulating layer and the second insulating layer so as to expose a top surface of the mask pattern and the remaining surface of the second region excluding part of the surface of the second region contacting the first region; substantially completely exposing the second region by etching the first insulating layer so as to remove part of the surface of the first insulating pattern contacting the semiconductor substrate; growing an epitaxial layer over the exposed second region; removing the mask pattern, the second insulating pattern, and the first insulating pattern so as to expose a surface of the epitaxial layer and a top surface and sidewalls of the gate conductive layer; forming an ion implantation buffer layer on the exposed surface of the epitaxial layer and a surface of the gate conductive layer; forming a lightly-doped impurity region in the epitaxial layer and the semiconductor substrate by performing a first ion implantation process; removing the ion implantation buffer layer so as to expose the lightly-doped impurity region and a top surface and sidewalls of the gate conductive layer pattern; sequentially forming a third insulating layer and a fourth insulating layer on the exposed surfaces of the lightly-doped impurity region and the gate conductive layer pattern; forming spacers by etching the third insulating layer and the fourth insulating layer so as to expose part of the surface of the epitaxial layer; and forming a heavily-doped impurity region in the epitaxial layer and the semiconductor substrate by performing an ion implantation process using the spacers as an ion implantation mask.

The second insulating layer is preferably formed of a material having an etch selectivity with respect to the first insulating layer.

The epitaxial layer is preferably formed to a thickness of approximately 20 Å to approximately 200 Å.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein.

Figure 13:
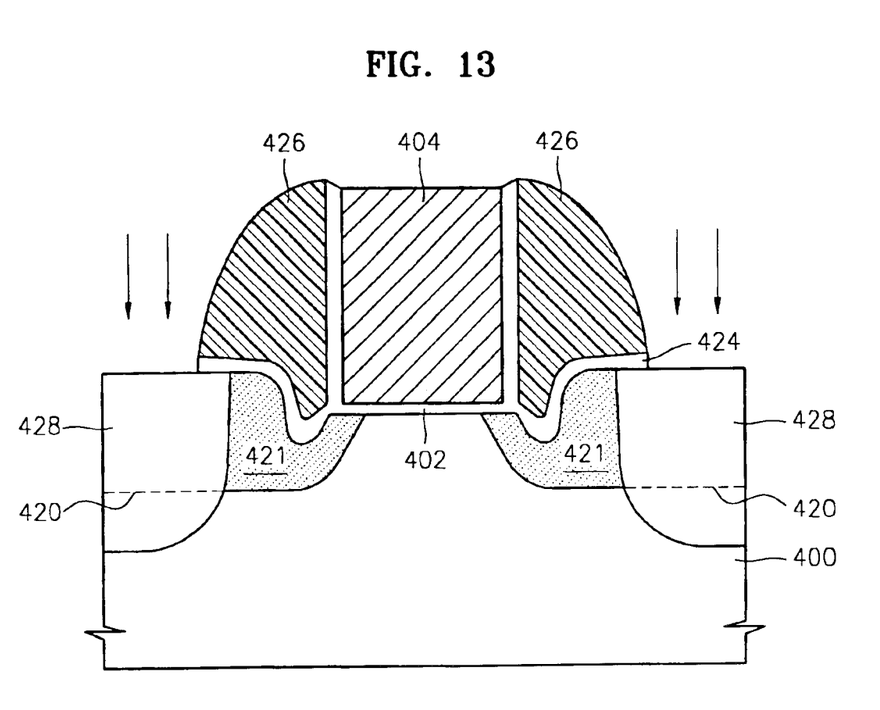

FIG. 13 is a cross-sectional view of the final structure of a MOSFET according to the present invention.

Referring to FIG. 13, the MOSFET according to the present invention comprises a gate insulating layer pattern 402 and a gate conductive layer pattern 404, which are sequentially stacked on a channel region of a semiconductor substrate 400. As shown in the figure a portion of the semiconductor substrate 400 disposed below the gate insulating layer pattern 402 and the gate conductive layer pattern has a first region and adjacent to the first region is a second region, the first region is thicker than the second region. As will be described in detail later, this is because the surface of the second region, which is the exposed portion of the semiconductor substrate 400, is recessed due to an etch process for forming the gate conductive layer pattern 404, a subsequent other etch process, and a cleaning process. As described in the Background of the Invention, the recessed semiconductor substrate 400 causes increases in the resistances of an LDD region 421 and a source/drain region 428, which are disposed in the second region of the semiconductor substrate 400, and also a reduction in the effective channel length.

To solve the foregoing problems, the MOSFET according to the present invention comprises an epitaxial layer 420 formed on the second region of the semiconductor substrate 400. The epitaxial layer 420 can compensate for the recessed portion of the second region. Thus, the resistance of the source/drain region 428 and the effective channel length can be maintained at constant levels. Spacers, which include double insulating layers 424 and 426, are formed on sidewalls of the gate conductive layer pattern 404 and part of the surface of the epitaxial layer 420.

FIGS. 4 through 12 are cross-sectional views illustrating a method of fabricating a MOSFET according to the present invention.

Figure 4:
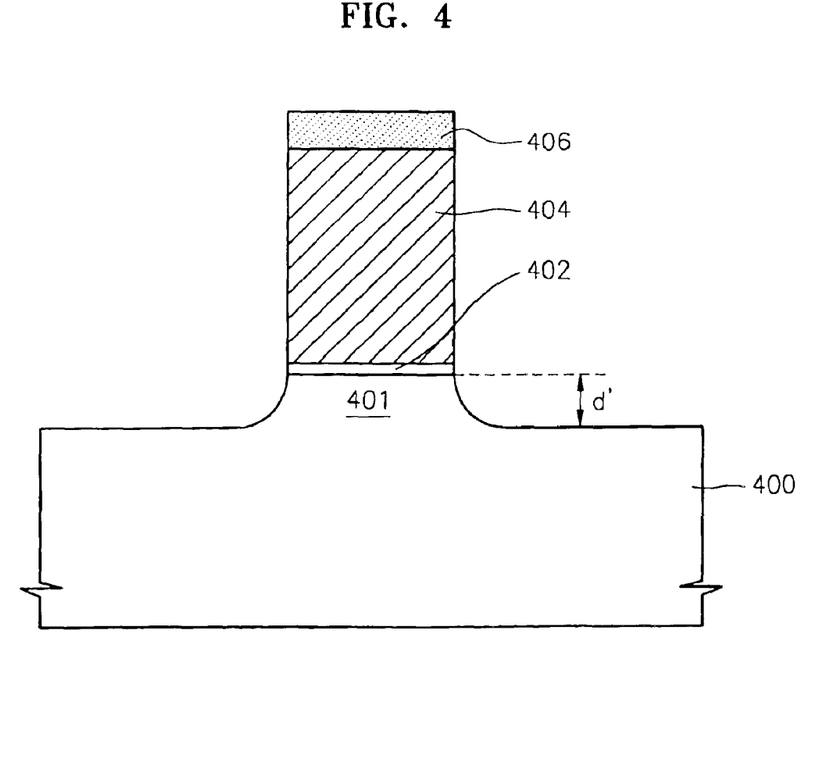
FIGS. 4 through 13 are cross-sectional views illustrating a method of fabricating a MOSFET according to the present invention.

Referring to FIG. 4, a semiconductor substrate 400, which is formed of silicon and has a uniform thickness, is prepared. An insulating layer and a gate conductive layer are sequentially formed on the semiconductor substrate 400. The insulating layer is a thin silicon oxide layer, and the gate conductive layer is a polysilicon layer. A mask pattern 406 is formed on the gate conductive layer to expose part of the surface of the gate conductive layer. The mask pattern 406 is an anti-reflection layer (ARL) pattern. An etch process is performed by using the mask pattern 406 as an etch mask to remove exposed portions of the gate conductive layer and the insulating layer. As a result, a gate insulating layer pattern 402 and a gate conductive layer 404 are formed. Also, by way of the etch process, part of the surface of the semiconductor substrate 400 is recessed by a predetermined thickness d', for example, several Å to several tens of Å, and exposed. Thus, while the semiconductor substrate 400 disposed below the gate insulating layer pattern 402 and the gate conductive layer pattern 404, i.e., a channel region, can maintain the initial thickness, the remaining portion of the semiconductor substrate 400 becomes thinner by the predetermined thickness d'.

Figure 5:
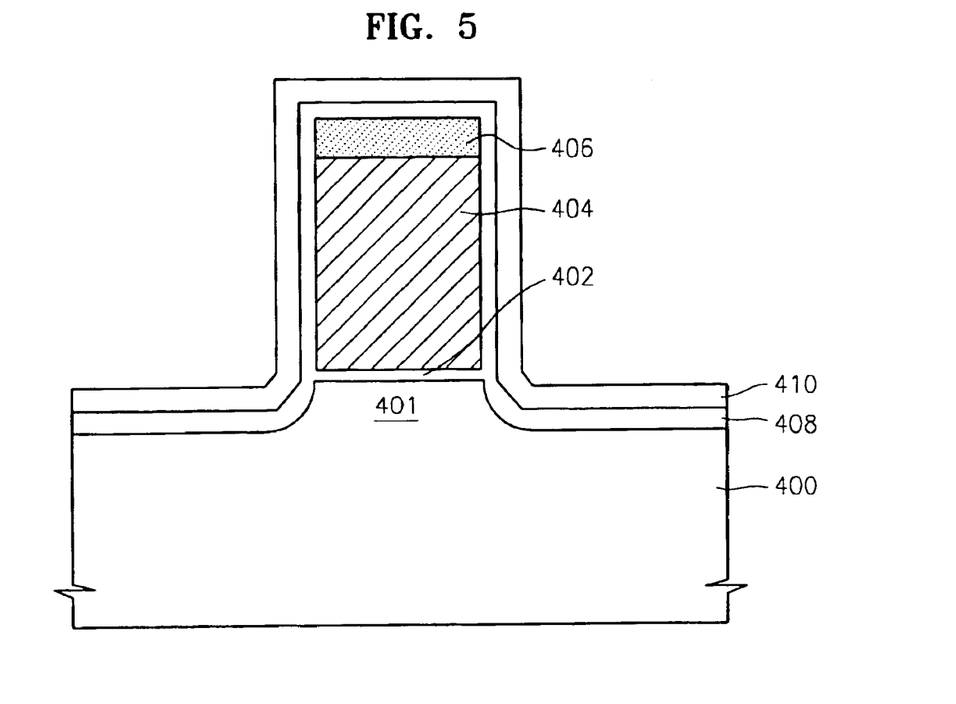

Referring to FIG. 5, a first insulating layer 408 is formed on the entire surface of the semiconductor substrate 400 where the gate conductive layer pattern 404 is formed. The first insulating layer 408 covers the exposed surface of the semiconductor substrate 400, sidewalls of the gate insulating layer pattern 402, sidewalls of the gate conductive layer pattern 404, and the top surface and sidewalls of the mask pattern 406. The first insulating layer 408 is formed using chemical vapor deposition (CVD) to a thickness of about several tens of Å. A second insulating layer 410 is formed on the entire surface of the first insulating layer 408. The second insulating layer 410 is formed using a material having an etch selectivity with respect to the first insulating layer 408 and to a thickness of about several Å to several tens of Å.

Figure 6:
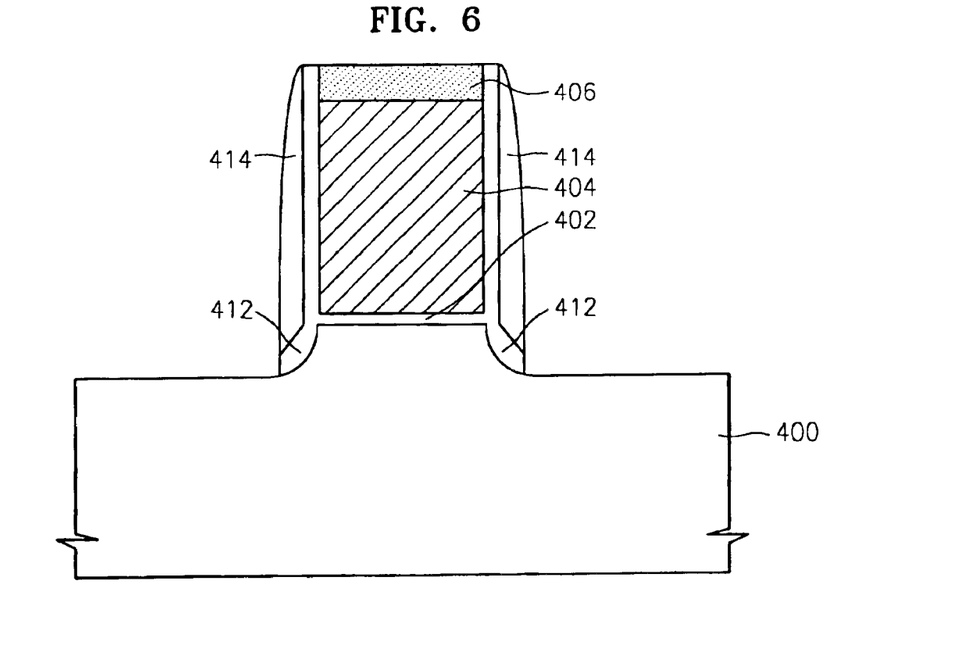

Referring to FIG. 6, the second insulating layer 410 and the first insulating layer 408 are etched using a dry etch process to form a first insulating pattern 412 and a second insulating pattern 414, respectively. By way of the etch process, a top surface of the mask pattern 406 and part of the surface of the semiconductor substrate 400 are exposed, and the first insulating pattern 412 and the second insulating pattern 414 form spacers. The spacer-shaped first insulating pattern 412 and second insulating pattern 414 can prevent a bridge phenomenon from occurring between a portion where an epitaxial layer is grown and the gate conductive layer pattern 404 during a subsequent process of growing the epitaxial layer.

Figure 7:
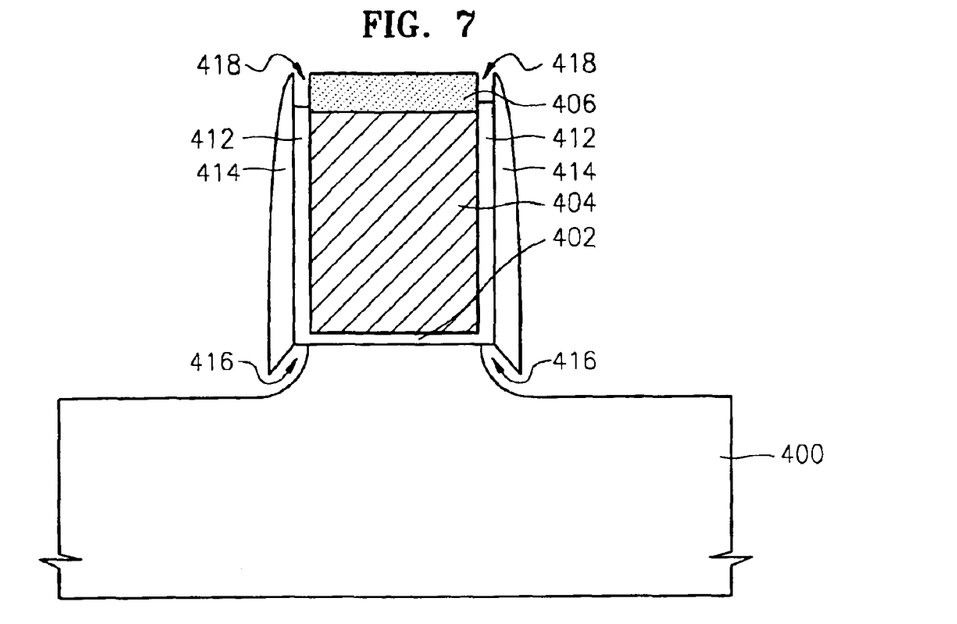

Referring to FIG. 7, a portion of the first insulating pattern 412 is etched and removed by a wet etch process using an etch selectivity with respect to the second insulating pattern 414. Here, a portion of the first insulating pattern 412 contacting the semiconductor substrate 400 disposed there under is removed. Thus, a gap 416 is generated between a lower portion of the second insulating pattern 414 and the semiconductor substrate 400. Meanwhile, because an additional mask pattern is not used during the etch process, the upper exposed portion of the first insulating pattern 412 is also removed. As a result, another gap 418 is generated between an upper portion of the second insulating pattern 414 and the mask pattern 406. However, even after the etch process is completed, the sidewalls of the gate conductive layer pattern 404 are still covered with the first insulating pattern 412.

Figure 8:
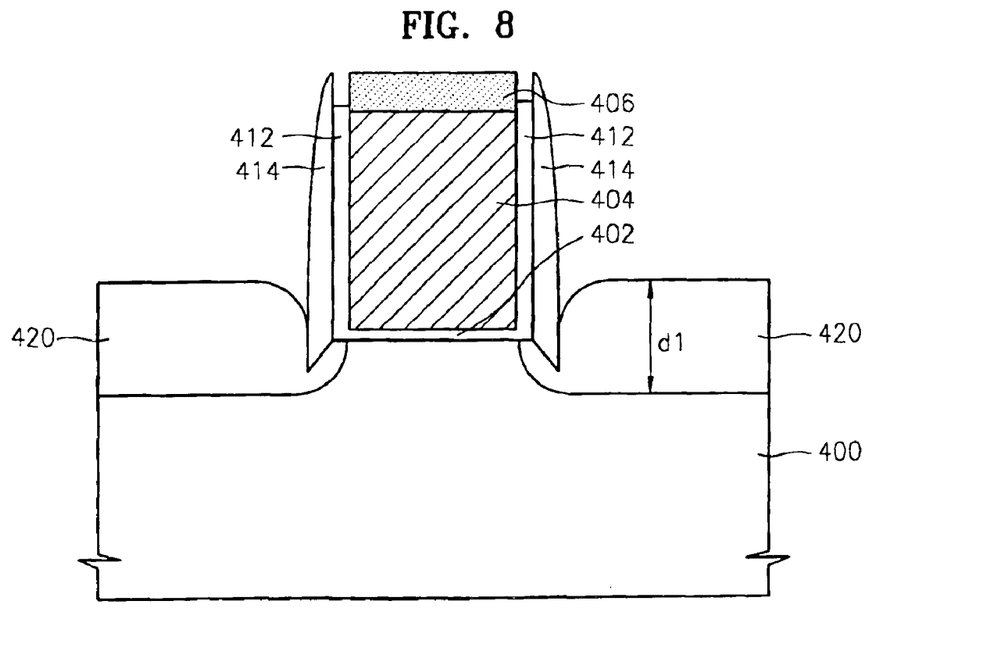

Referring to FIG. 8, an epitaxial layer 420 is grown over the exposed surface of the semiconductor substrate 400. The grown thickness d1 of the epitaxial layer 420 may be determined within a large range of about several tens of Å to several hundreds of Å. Preferably, the grown thickness d1 of the epitaxial layer 420 is greater than the recessed thickness (d' of FIG. 4) of the semiconductor substrate 400. Meanwhile, while the epitaxial layer 420 is being grown on the exposed surface of the semiconductor substrate 400, the bottom profiles of the first insulating pattern 412 and the second insulating pattern 414, which contact the epitaxial layer 420, may be transformed to a certain extent under the pressure caused by the epitaxial layer 420.

Figure 9:
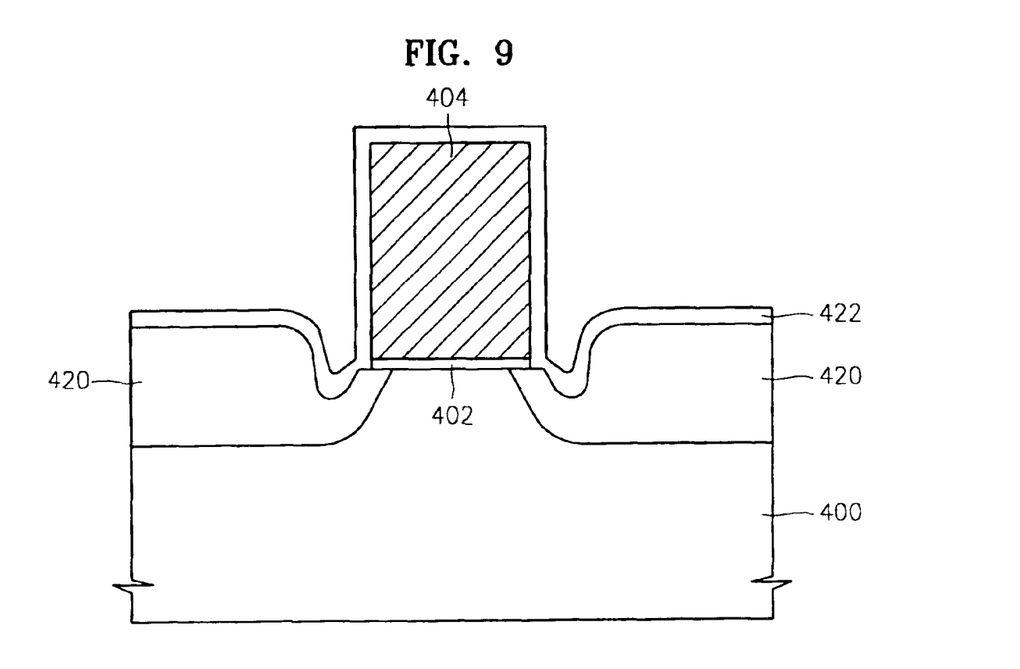

Referring to FIG. 9, the first insulating pattern 412 and the second insulating pattern 414 are removed using a wet etch process. After the etch process is completed, the mask pattern 406 is also removed. Once the first insulating pattern 412, the second insulating pattern 414, and the mask pattern 406 are all removed, a top surface and sidewalls of the gate conductive layer pattern 404 are exposed. The etch process is typically followed by a cleaning process. Next, a third insulating layer 422 is formed as an ion implantation buffer layer on the resultant structure where the exposed gate conductive layer pattern 404 is formed. In a case where the gate conductive layer pattern 404 is a polysilicon pattern, the third insulating layer 422 may be formed of a silicon oxide layer using CVD or a conventional oxidation process.

Figure 10:
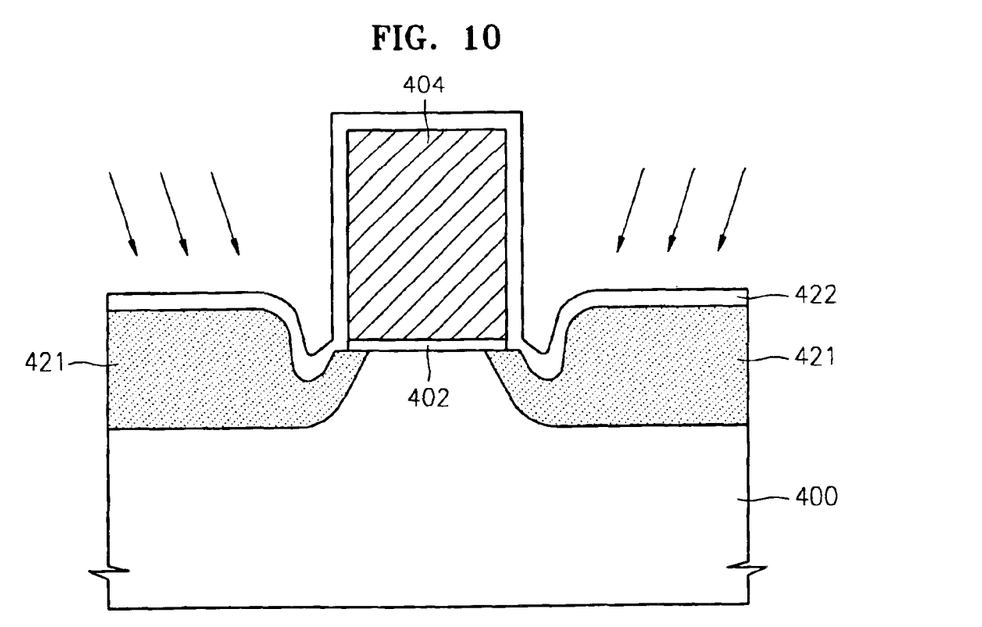
Figure 11:
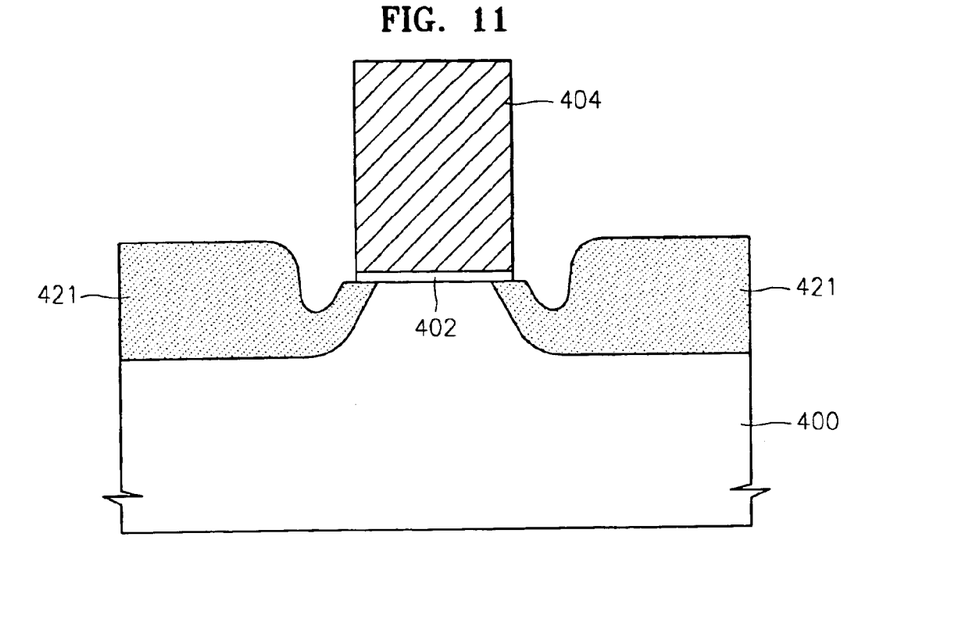

Referring to FIG. 10, an ion implantation process is implemented by using the third insulating layer 422 as an ion implantation buffer layer. Thus, an LDD region 421 is formed. In FIG. 10, the arrows indicate the implantation of impurity ions. During the ion implantation process for forming the LDD region 421, the ion implantation energy is determined such that the LDD region 421 is formed to a desired depth. As shown in FIG. 1, after forming the LDD region 421, the third insulating layer 422 is removed so as to expose the surface of the LDD region 421 and the top surface and sidewalls of the gate conductive layer pattern 404.

Figure 12:
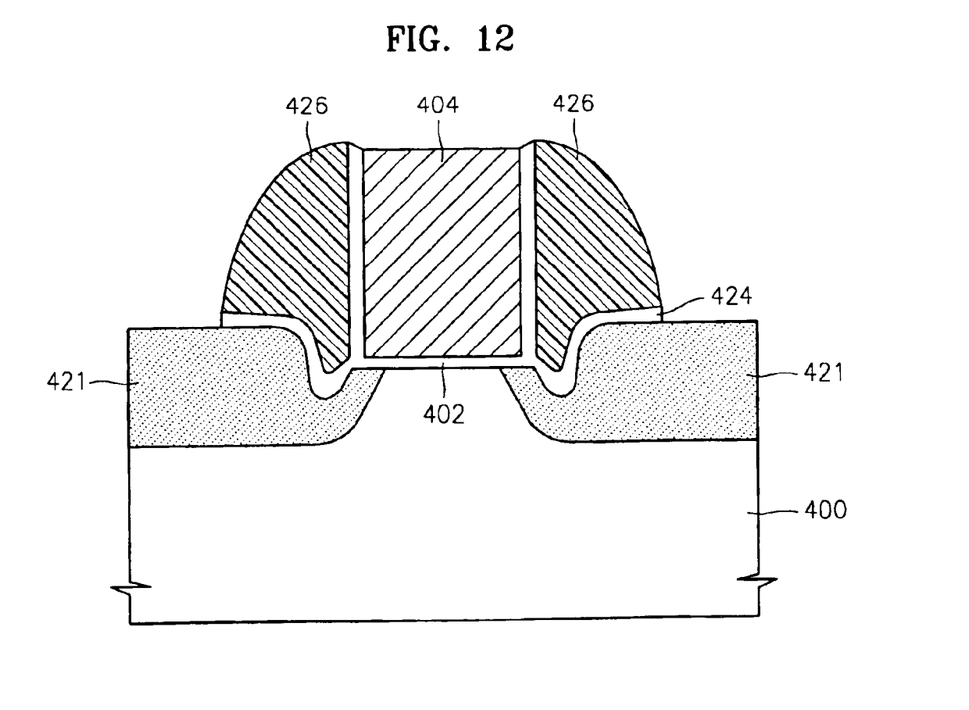

Referring to FIG. 12, a fourth insulating layer and a fifth insulating layer are sequentially formed on the resultant structure of FIG. 1. The fourth insulating layer is formed to a relatively thin thickness using a silicon oxide layer, while the fifth insulating layer is formed to a relatively thick thickness using a silicon nitride layer. In particular, the thickness of the fifth insulating layer is determined in consideration of a desired thickness of spacers to be formed. Next, the spacers, which include the third insulating pattern 424 and the fourth insulating pattern 426, are formed using a dry etch process on the sidewalls of the gate conductive layer pattern 404. As a result, the top surface of the gate conductive layer pattern 404 and part of the surface of the LDD region 421 are exposed.

Referring to FIG. 13, an ion implantation process is implemented by using the gate conductive layer pattern 404 and the fourth insulating pattern 426 as an ion implantation mask, thereby forming a deep source/drain region 428. In FIG. 13, the arrows indicate the implantation of impurity ions. Similarly, the ion implantation energy is determined such that the source/drain region 428 is formed to a desired depth.

As explained so far, according to the present invention, even if a portion of the semiconductor substrate is recessed due to the etch process for forming the gate conductive layer pattern and other subsequent etch processes, owing to the formation of the epitaxial layer, the effective channel length and the resistance of the source/drain region can be maintained at constant levels before and after the ion implantation process.

What is claimed is:

1. A MOSFET comprising:
    a semiconductor substrate with a relatively thick first region and a relatively thin second region;
    a gate insulating layer pattern formed on said first region of the semiconductor substrate;
    a gate conductive layer pattern formed on the gate insulating layer pattern;
    an epitaxial layer formed on said second region of the semiconductor substrate so as to have a predetermined thickness;
    spacers formed an sidewalls of the gate conductive layer pattern and part of the surface of the epitaxial layer;
    a lightly-doped first impurity region formed in the semiconductor substrate disposed below the spacers and in the epitaxial layer; and
    a heavily-doped second impurity region formed in a portion of the semiconductor substrate, exposed by the spacers.

2. The MOSFET of claim 1, wherein the semiconductor substrate is a silicon substrate, and the epitaxial layer is a silicon epitaxial layer.

3. The MOSFET of claim 1, wherein the sum of the thickness of the epitaxial layer and the thickness of said second region is greater than the thickness of said first region.

4. The MOSFET of claim 1, wherein said first region has a first thickness, said second region has a second thickness, and the sum of the thickness of said epitaxial layer and said second thickness is greater than said first thickness.

5. The MOSFET of claim 4, wherein the thickness of the epitaxial layer ranges from approximately 20 to approximately 500 Å.

6. The MOSFET of claim 1, wherein the gate insulating layer pattern and the insulating layer are silicon oxide layers, and the gate conductive layer pattern is a polysilicon pattern.

7. The MOSFET of claim 1, wherein the spacers include double insulating, layers.

8. The MOSFET of claim 1, wherein the thickness of the epitaxial layer ranges from approximately 20 to approximately 500 Å.

9. A MOSFET comprising:
- a semiconductor substrate with a relatively thick first region and a relatively thin second region;
- a gate insulating layer pattern formed on said first region of the semiconductor substrate;
- a gate conductive layer pattern formed on the gate insulating layer pattern;
- an epitaxial layer formed on said second region of the semiconductor substrate so as to have a predetermined thickness, the sum of the thickness of said epitaxial layer and the thickness of said second region being greater than the thickness of said first region;
- spacers formed on sidewalls of the gate conductive layer pattern and part of the surface of the epitaxial layer;
- a light-doped first impurity region formed in the semiconductor substrate disposed below the spacers and in the epitaxial layer; and
- a heavily-doped second impurity region formed in a portion of the semiconductor substrate, exposed by the spacers.

10. The MOSFET of claim 9, wherein the thickness of the epitaxial layer ranges from approximately 20 to approximately 500 Å.

11. The MOSFET method of claim 9, wherein the gate insulating layer pattern and the insulating layer are silicon oxide layers, and the gate conductive layer pattern is polysilicon.

* * * * *

UNITED STATES PATENT AND TRADEMARK OFFICE
CERTIFICATE OF CORRECTION

| | | |
|---|---|---|
| PATENT NO. | : 6,960,785 B2 | Page 1 of 1 |
| APPLICATION NO. | : 10/676304 | |
| DATED | : November 1, 2005 | |
| INVENTOR(S) | : Jin et al. | |

It is certified that error appears in the above-identified patent and that said Letters Patent is hereby corrected as shown below:

Column 6, line 1, please replace "FIG.1." with --FIG.11.--

Column 8, line 1, please replace "light-doped" with --lightly-doped--

Signed and Sealed this

Twenty-first Day of November, 2006

JON W. DUDAS
*Director of the United States Patent and Trademark Office*